US009601211B1

(12) United States Patent
Yang (10) Patent No.: US 9,601,211 B1
(45) Date of Patent: Mar. 21, 2017

(54) SEMICONDUCTOR MEMORY DEVICE

(71) Applicant: SK hynix Inc., Icheon-si Gyeonggi-do (KR)

(72) Inventor: Chang Won Yang, Icheon-si Gyeonggi-do (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 15/135,876

(22) Filed: Apr. 22, 2016

(30) Foreign Application Priority Data

Dec. 9, 2015 (KR) .......................... 10-2015-0175046

(51) Int. Cl.
| G11C 11/34 | (2006.01) |
| G11C 16/26 | (2006.01) |
| G06F 13/40 | (2006.01) |
| G06F 13/16 | (2006.01) |
| G11C 16/08 | (2006.01) |
| G11C 16/04 | (2006.01) |

(52) U.S. Cl.
CPC .......... G11C 16/26 (2013.01); G06F 13/1673 (2013.01); G06F 13/4022 (2013.01); G11C 16/0483 (2013.01); G11C 16/08 (2013.01)

(58) Field of Classification Search
CPC ..... G11C 16/26; G11C 16/08; G11C 16/0483; G06F 13/4022; G06F 13/1673
USPC ........................... 365/185.12, 185.13, 185.05
See application file for complete search history.

(56) References Cited

U.S. PATENT DOCUMENTS

| 5,768,215 | A  | * | 6/1998  | Kwon ................. | G11C 7/1021 365/185.12 |
| 5,818,786 | A  | * | 10/1998 | Yoneda ................ | G11C 7/18 365/189.05 |
| 5,966,340 | A  | * | 10/1999 | Fujino ................. | G11C 8/14 365/226 |
| 6,118,723 | A  | * | 9/2000  | Agata ................. | G11C 8/14 365/230.03 |
| 6,314,042 | B1 | * | 11/2001 | Tomishima .......... | G11C 7/1006 365/230.03 |
| 9,404,946 | B2 | * | 8/2016  | Lee .................... | G11O 5/148 |
| 2001/0024384 | A1 | * | 9/2001  | Arimoto .............. | G11C 29/28 365/200 |
| 2002/0048210 | A1 | * | 4/2002  | Tomotani ............ | G11C 8/10 365/230.03 |
| 2002/0186611 | A1 | * | 12/2002 | Aritomi .............. | G11C 8/14 365/230.06 |
| 2006/0145193 | A1 | * | 7/2006  | So .................... | G11C 8/10 257/208 |
| 2007/0030737 | A1 | * | 2/2007  | Aritome ............. | G11C 16/0483 365/185.25 |

(Continued)

FOREIGN PATENT DOCUMENTS

| KR | 1020060012665 A | 2/2006 |
| KR | 100742278 B1 | 7/2007 |

*Primary Examiner* — Viet Q Nguyen
(74) *Attorney, Agent, or Firm* — William Park & Associates Ltd.

(57) ABSTRACT

A semiconductor memory device may include a memory cell array, two or more global word lines, and two or more path circuits. The two or more global word lines may be coupled to word lines in parallel. At least one of the two or more path circuits may be coupled between portions of each word line portions of each word line. Each path circuit may couple one of the global word lines to one of the word lines.

10 Claims, 8 Drawing Sheets

(56) References Cited

U.S. PATENT DOCUMENTS

| | | | |
|---|---|---|---|
| 2007/0121388 A1* | 5/2007 | Lee | G11C 16/30 |
| | | | 365/185.29 |
| 2008/0080229 A1* | 4/2008 | Choi | G11C 8/08 |
| | | | 365/148 |
| 2009/0092000 A1* | 4/2009 | Hara | G11C 8/10 |
| | | | 365/230.06 |
| 2010/0271862 A1* | 10/2010 | Yoon | G11C 8/10 |
| | | | 365/148 |
| 2012/0257452 A1* | 10/2012 | Kim | G11C 16/0483 |
| | | | 365/185.11 |
| 2015/0199998 A1* | 7/2015 | Oh | G11C 5/02 |
| | | | 365/63 |

* cited by examiner

SEMICONDUCTOR MEMORY DEVICE

CROSS-REFERENCE TO RELATED APPLICATION

The present application claims priority under 35 U.S.C. §119(a) to Korean patent application number 10-2015-0175046 filed on Dec. 9, 2015, in the Korean Intellectual Property Office, the entire disclosure of which is incorporated herein by reference.

BACKGROUND

1. Technical Field

Embodiments of the present disclosure generally relate to an electronic device, and more particularly to a semiconductor memory device.

2. Related Art

Semiconductor memory device may be classified into volatile memory devices and nonvolatile memory devices.

Although the nonvolatile memory device has a relatively low write and read speed, it maintains stored data even without any external power source. The nonvolatile memory device is typically used for long-term persistent storage. Examples of the nonvolatile memory device include a Read Only Memory (ROM), a Mask ROM (MROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. The flash memory may be divided into a NOR type and a NAND type.

Like random-access memories (RAM), the flash memory may be freely programmed and erased, and, like the ROM, the data stored in the flash memory can be maintained even in the absence of a power supply. The flash memory is widely used as a storage medium of a portable electronic device, such as a digital camera, a Personal Digital Assistant (PDA), and an MP3 player.

SUMMARY

In an embodiment of the present disclosure, a semiconductor memory device may include a memory cell array, two or more global word lines, and two or more path circuits. The two or more global word lines may be coupled to word lines in parallel. At least one of the two or more path circuits may be coupled between portions of each word line portions of each word line. Each path circuit may couple one of the global word lines to one of the word lines.

In an embodiment of the present disclosure, a semiconductor memory device may include a memory cell array and a plurality of page buffers. The memory cell array may include a plurality of memory strings coupled to a plurality of bit lines. The plurality of page buffers may be coupled to the plurality of bit lines, respectively. Each of the page buffers may include a plurality of sub-page buffers and a main page buffer.

In an embodiment of the present disclosure, a semiconductor memory device may include a memory cell array, two or more global word lines, two or more path circuits, and two or more path circuits. The memory cell array may include a plurality of memory strings coupled to a plurality of bit lines. The two or more global word lines may extend along a direction to which the plurality of bit lines extends. The two or more path circuits may electrically connect the plurality of global word lines to word lines. The plurality of page buffers may be coupled to the plurality of bit lines, respectively. Each of the page buffers may include a plurality of sub-page buffers and a main page buffer.

DETAILED DESCRIPTION OF THE INVENTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Advantages and features of the present disclosure and methods of achieving the advantages and features will be clear with reference to exemplary embodiments described in detail below together with the accompanying drawings. However, the present disclosure is not limited to the exemplary embodiments described herein, and may be implemented in various different forms. However, the exemplary embodiments described herein are provided so as to describe the present disclosure in detail so that those skilled in the art may easily carry out the technical spirit of the present disclosure.

Throughout this specification and the claims that follow, when it is described that an element is "coupled" to another element, the element may be "directly coupled" to the other element or "electrically coupled" to the other element through a third element. Throughout the specification and the claims, unless explicitly described to the contrary, the word "comprise" and variations such as "comprises" or "comprising" will be understood to imply the inclusion of stated elements but not the exclusion of any other elements.

Figure 1:
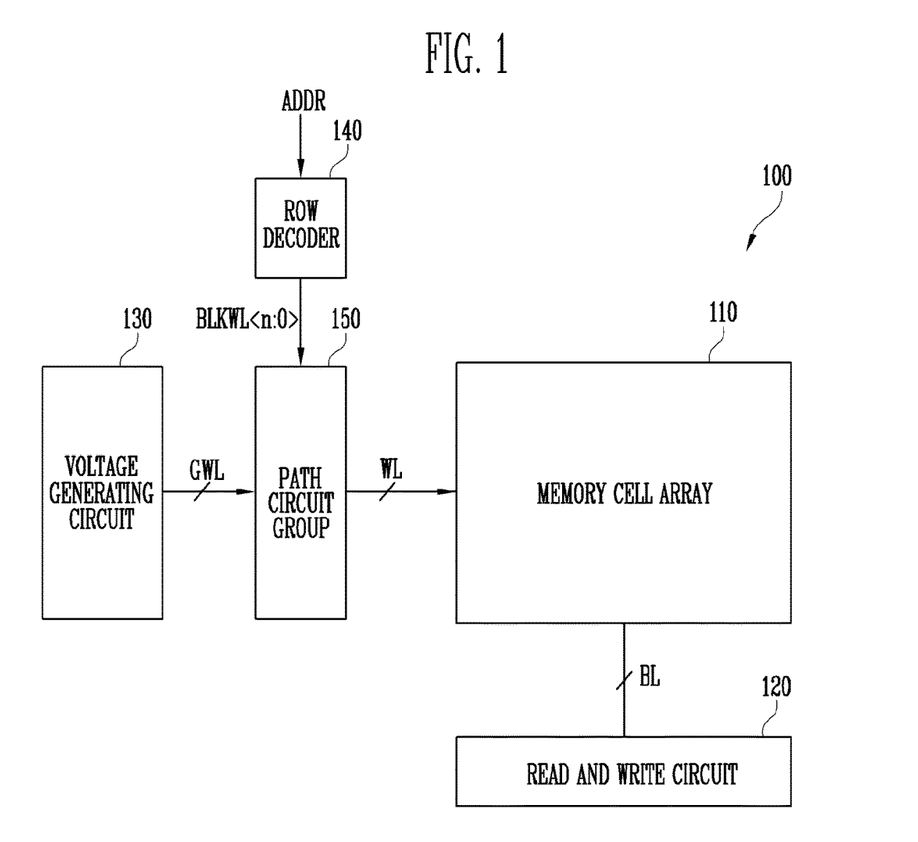
FIG. 1 is a diagram illustrating an example of a semiconductor memory device according to an embodiment of the present disclosure.

FIG. 1 is a diagram illustrating an example of a semiconductor memory device according to an embodiment of the present disclosure.

Referring to FIG. 1, a semiconductor 100 may include a memory cell array 110, a read/write circuit 120, a voltage generating circuit 130, a block decoder 140, and a path circuit group 150.

For example, if the memory cell array 110 includes a plurality of memory blocks (not illustrated), the plurality of memory blocks may be coupled to the path circuit group 150 through word lines WL. The memory cell array 110 may be coupled to the read/write circuit 120 through bit lines BL. In an embodiment, the memory cell array 110 may include a plurality of memory strings. Each memory string may include a drain select transistor, a plurality of memory cells, and a source select transistor, which are coupled in series between a bit line and a source line. In an embodiment, the plurality of memory cells is non-volatile memory cells, and more particularly, the plurality of memory cells may be non-volatile memory cells based on a charge trap device.

The read/write circuit 120 may include a plurality of page buffers (not illustrated). The plurality of page buffers may be coupled to corresponding bit lines of the memory cell array 110, respectively.

The read/write circuit 120 may temporarily store data input from an external devices during a program operation and adjust bit line potentials of bit lines BL according to the temporarily stored data. Further, the read/write circuit 120 may generate read data or verification data by sensing potential levels or amounts of current of the bit lines BL, which varies according to data stored in the memory cells of the memory cell array 110, during a read operation or a verification operation.

A relation between the memory cell array 110 and the read/write circuit 120 and an example configuration of the read/write circuit 120 will be described below.

The voltage generating circuit 130 may generate a plurality of operation voltages that will be applied to word lines WL of the memory cell array 110 during a general operation such as a program operation and a read operation, and may apply the operation voltages to global word lines GWL.

The block decoder 140 may output one or more of block select signals selected between a plurality of block select signals BLKWL<n:0> in response to an address signal ADDR.

The path circuit group 150 may be coupled between the global word lines GWL and the word lines of the memory cell array 110. The path circuit group 150 may selectively connect the global word lines GWL to the word lines WL in response to the block select signal BLKWL<n:0> output from the block decoder 140.

A relation between the word lines WL of the memory cell array 110 and the global word lines WL and an example configuration of the path circuit group 150 will be described below.

Figure 2:
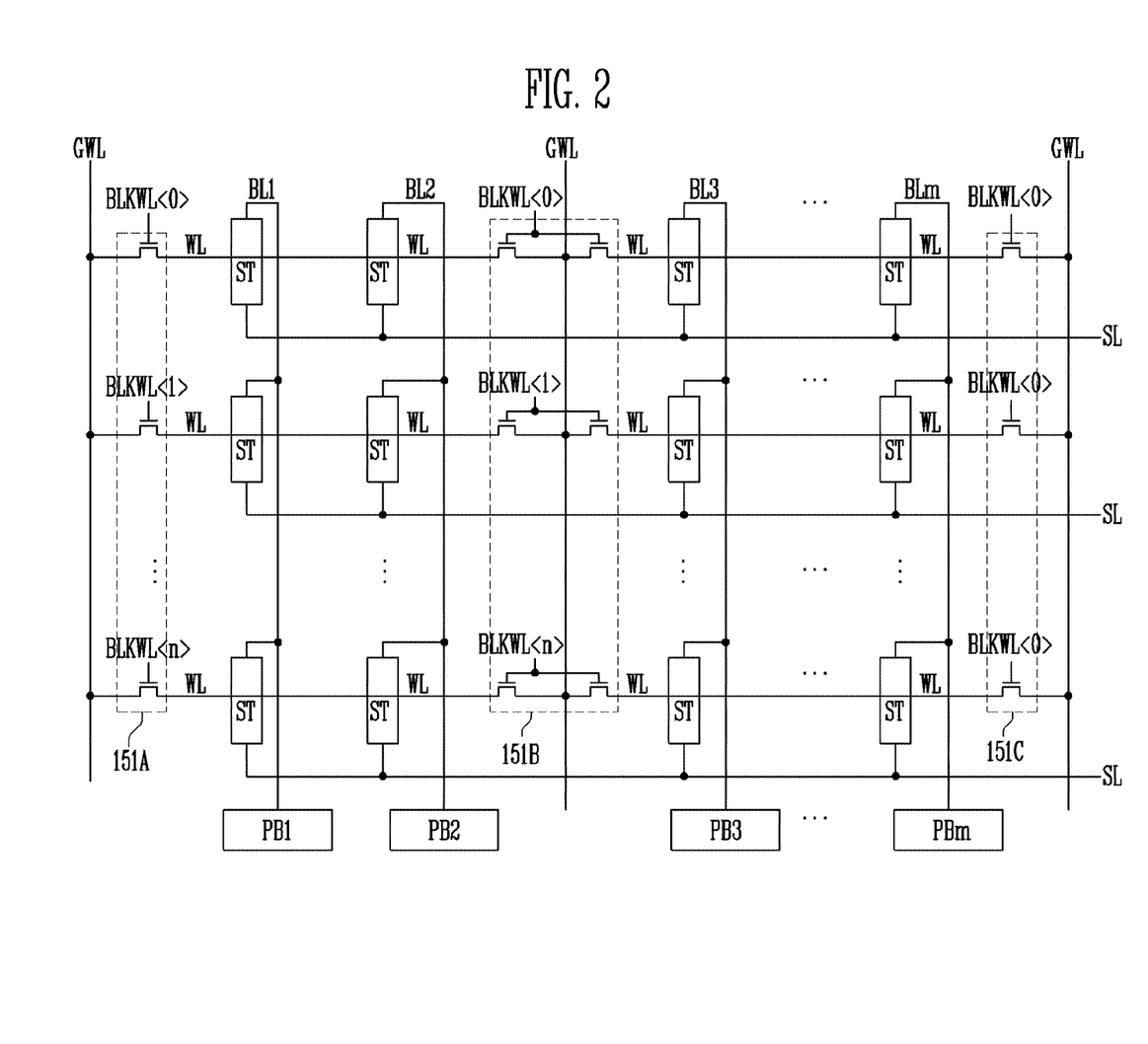
FIG. 2 is a diagram illustrating an example configuration of a memory cell array and a global word line according to an embodiment of the present disclosure.

FIG. 2 is a diagram illustrating an example configuration of the memory cell array and the global word lines illustrated in FIG. 1 according to an embodiment of the present disclosure.

Referring to FIG. 2, the memory cell array may include a plurality of memory strings ST. The plurality of memory strings ST may be coupled between a plurality of bit lines BL1 to BLm and a source line SL. Some of the memory strings ST may share some of the word lines WL.

Two or more global word lines GWL may be coupled to word lines in parallel. For example, the global word lines GWL may extend in the bit line direction. The path circuit group 150 (see FIG. 1) may include a plurality of path circuits 151A, 151B, and 151C. The global word lines GWL may be coupled to the word lines WL through the plurality of path circuits 151A, 151B, and 151C. That is, the two or more global word lines GWL are connected to the word lines WL through the plurality of path circuits 151A, 151B, and 151C of the path circuit group 150 (see FIG. 1) in parallel. The word lines WL may be coupled to gates of memory cells included in the memory strings ST.

The plurality of path circuits 151A, 151B, and 151C may electrically connect the global word lines GWL to the word lines WL in response to the plurality of block select signals BLKWL<n:0> generated by the block decoder 140 (see FIG. 1).

In an embodiment, two or more global word lines may be provided in one memory cell array, so that shorter lengths of the word lines WL connected to one global word line GWL may reduce the load on the word lines. Accordingly, a time for applying the operation voltage to the word line during the general operation of the semiconductor memory device may be reduced. The two or more global word lines GWL may be electrically connected to each other, and the same operation voltage may be applied to the two or more global word lines GWL during the general operation of the semiconductor memory device.

Although FIG. 2 illustrates only three global word lines GWL, the number of the global word lines GWL is not limited thereto. In an embodiment, the global word lines GWL extend in a bit line direction. For example, one global word line WL may be assigned to the memory strings ST connected to one bit line.

Each of the plurality of bit lines BL1 to BLm may be coupled to one of the plurality of page buffers PB1 to PBm included in the read/write circuit 120.

Figure 3:
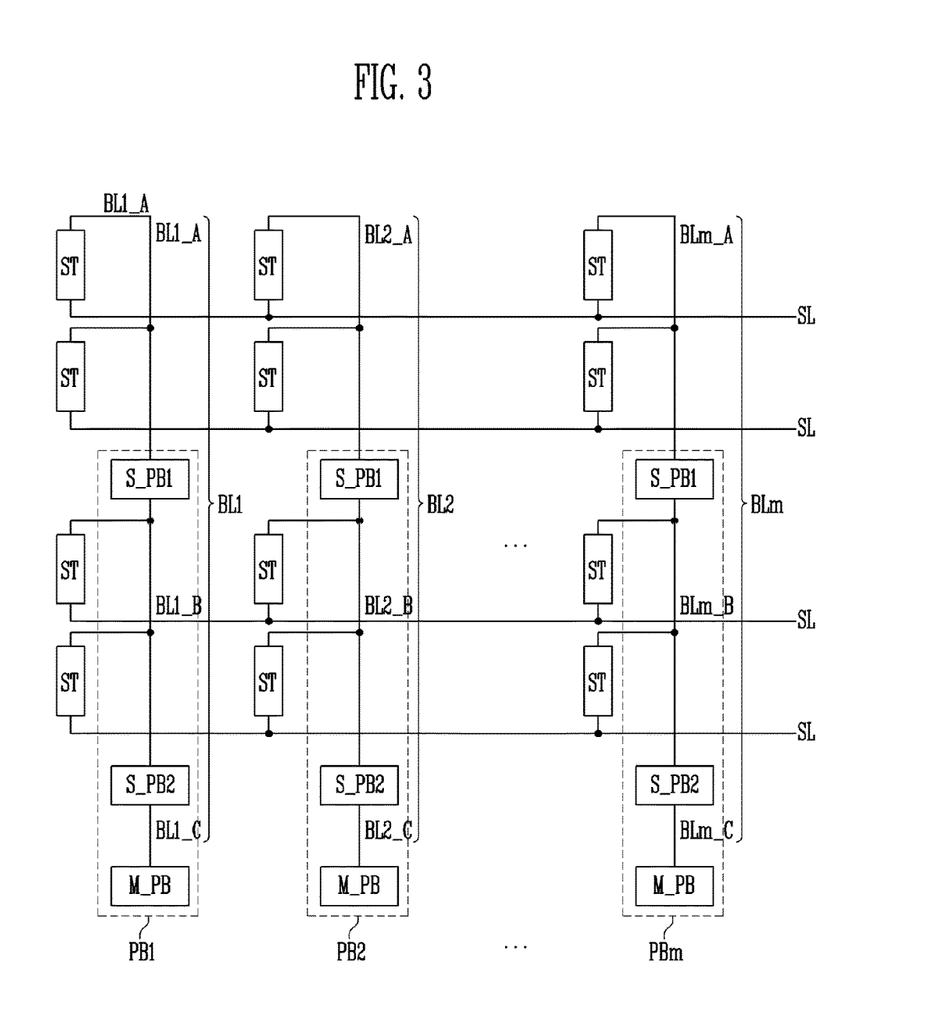
FIG. 3 is a diagram illustrating an example configuration of a memory cell array and a read/write circuit according to an embodiment of the present disclosure.

FIG. 3 is a diagram illustrating an example configuration of the memory cell array and the read/write circuit of FIG. 1 according to an embodiment of the present disclosure.

Referring to FIG. 3, the memory cell array may include a plurality of memory strings ST. The plurality of memory strings ST may be coupled between a plurality of bit lines BL1 to BLm and a source line SL.

Each of the plurality of bit lines BL1 to BLm may be divided into a plurality of internal bit lines (e.g., BL1_A, BL1_B, and BL1_C) by the read and write circuit 120 of FIG. 1.

Each of the plurality of bit lines BL1 to BLm may be coupled to one of the plurality of page buffers PB1 to PBm included in the read/write circuit 120. Each of the plurality of page buffers PB1 to PBm may include a plurality of sub-page buffers S_PB1 and S_PB2 and a main page buffer M_PB. Each of the plurality of bit lines BL1 to BLm may be divided into a plurality of internal bit lines (e.g., BL1_A, BL1_B, and BL1_C) by the plurality of sub-page buffers S_PB1 and S_PB2 and the main page buffer M_PB.

For example, the bit line BL1 may include the internal bit line BL1_A coupled to the sub-page buffer S_PB1, the internal bit line BL1_B coupled between the sub-page buffer S_PB1 and the sub-page buffer S_PB2, and the internal bit line BL1_C coupled between the sub-page buffer S_PB2 and the main page buffer M_PB.

When the plurality of bit lines BL1 to BLm is precharged during the general operation of the semiconductor memory device, the sub-page buffer S_PB1 may precharge the internal bit line BL1_A, the sub-page buffer S_PB2 may precharge the internal bit line BL1_B, and the main page buffer M_PB may precharge the internal bit line BL1_C.

During the precharge operation of the bit line, each of the plurality of bit lines BL1 to BLm may be divided into the plurality of internal bit lines BL1_A, BL1_B, and BL1_C, and the internal bit lines BL1_A, BL1_B, and BL1_C may be precharged by the plurality of sub-page buffers S_PB1 and S_PB2 and the main page buffer M_PB, thereby decreasing a precharge time.

Further, when threshold voltages of the memory cells of the memory strings ST are sensed during the general operation of the semiconductor memory device, the sub-page buffer S_PB1 may sense threshold voltages of the memory cells of the memory strings ST coupled to the internal bit line BL1_A, and the sub-page buffer S_PB2 may sense threshold voltages of the memory cells of the memory strings ST coupled to the internal bit line BL1_B. The data sensed by the sub-page buffer S_PB1 and the sub-page buffer S_PB2 may be transmitted to the main page buffer M_PB and may be used for a verification operation, or may be output to the external device.

Figure 4:
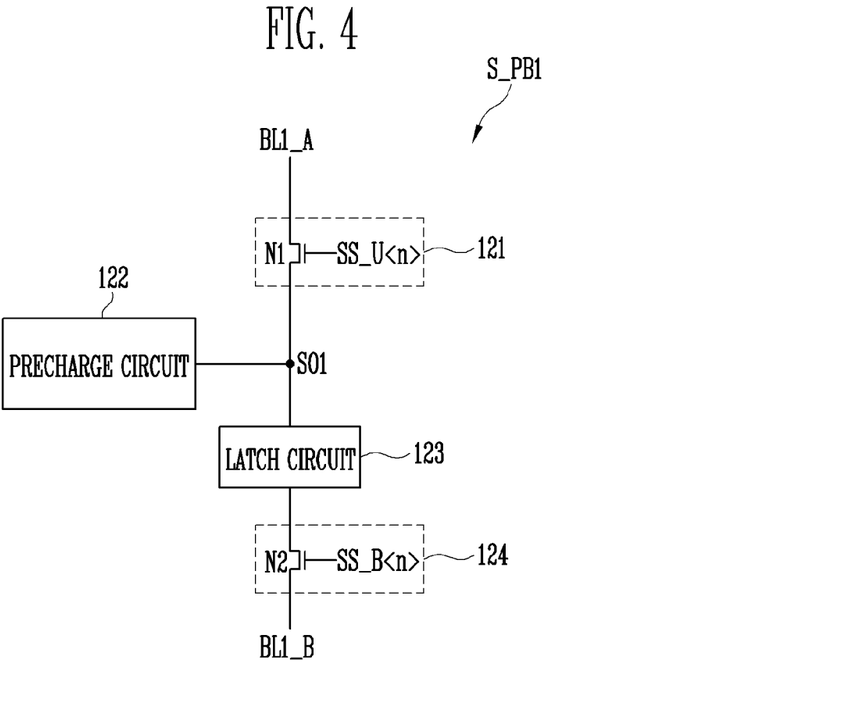
FIG. 4 is a diagram illustrating an example of a sub-page buffer illustrated in FIG. 3.

FIG. 4 is a diagram illustrating an example of the sub-page buffer illustrated in FIG. 3.

The sub-page buffer S_PB1 and the sub-page buffer S_PB2 may have the same or substantially the same configuration as each other.

Referring to FIG. 4, the sub-page buffer S_PB1 may be coupled between the internal bit line BL1_A and the internal bit line BL1_B. The sub-page buffer S_PB1 may include a first switching circuit 121, a precharge circuit 122, a latch circuit 123, and a second switching circuit 124.

The first switching circuit 121 may be coupled between the internal bit line BL1_A and a sub sensing node SO1, and may electrically connect the internal bit line BL1_A to the sub sensing node SO1 in response to a first switching signal SS_U<n>. The first switching circuit 121 may include a high-voltage transistor N1. The precharge circuit 122 may precharge the internal bit line BL1_A through the sub sensing node SO1 and the first switching circuit 121 during the precharge operation of the bit line. The latch circuit 123 may sense a potential level or an amount of current of the internal bit line BL1_A, which varies according to data stored in the memory cells, through the sub sensing node SO1 and the first switching circuit 121, and may store the data. The second switching circuit 124 may be coupled between the latch circuit 123 and the internal bit line BL1_B, and may transmit the data stored in the latch circuit 123 to the internal bit line BL1_B. The second switching circuit 124 may include a high-voltage transistor N2.

Figure 5:
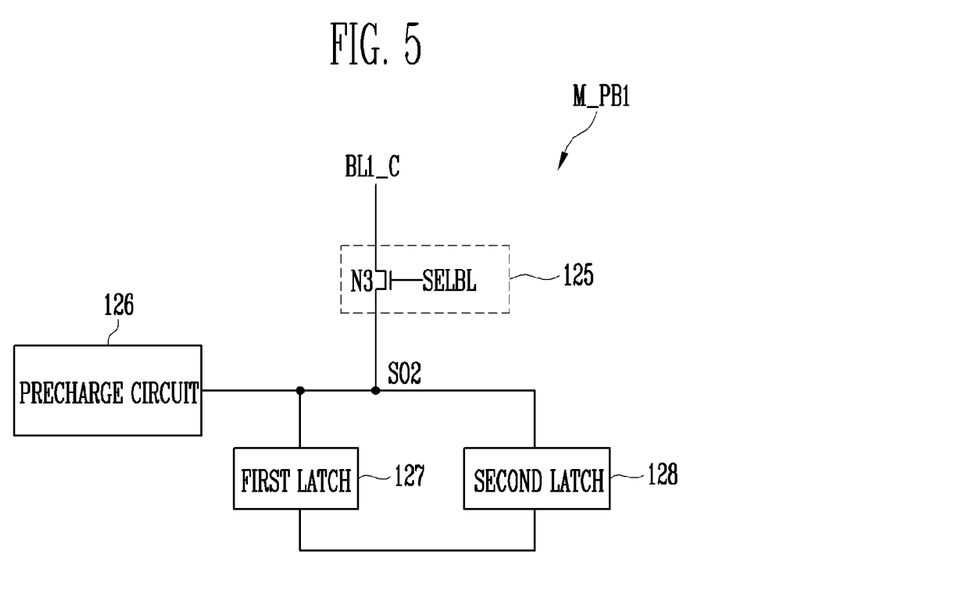
FIG. 5 is a diagram illustrating an example of a main page buffer illustrated in FIG. 3.

FIG. 5 is a diagram illustrating an example of the main page buffer illustrated in FIG. 3.

Referring to FIG. 5, the main page buffer M_PB1 may include a bit line selecting circuit 125, a precharge circuit 126, and first and second latches 127 and 128.

The bit line selecting circuit 125 may electrically connect the internal bit line BL1_B and a sensing node SO2 in response to a bit line select signal SELBL. The bit line selecting circuit 125 may include the NMOS transistor N3. The precharge circuit 126 may precharge the internal bit line BL1_B through the sensing node SO2 and the bit line selecting circuit 125 during the precharge operation of the bit line. The first and second latches 127 and 128 may temporarily store the data output from the sub-page buffer S_PB1 or the sub-page buffer S_PB2 of FIG. 3 during the sensing operation, and then may perform the verification operation by using the stored data or output the data to an external device.

Figure 6:
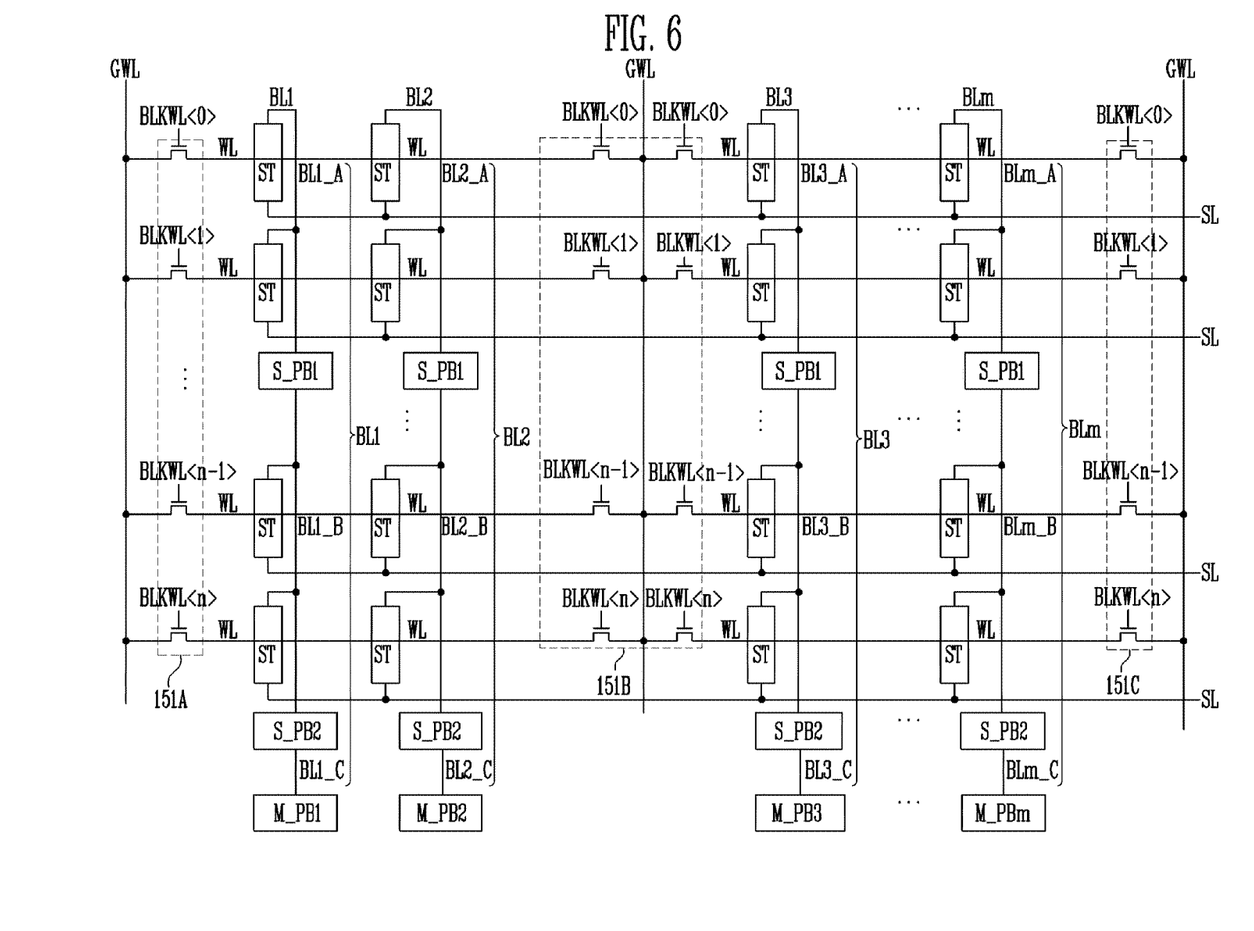
FIG. 6 is a diagram illustrating an example configuration of a memory cell array, global word lines, and a read/write circuit according to an embodiment of the present disclosure.

FIG. 6 is a diagram illustrating an example configuration of the memory cell array, the global word lines, and the read/write circuit according to an embodiment of the present disclosure.

Referring to FIG. 6, the memory cell array may include a plurality of memory strings ST. The plurality of memory strings ST may be coupled between a plurality of bit lines BL1 to BLm and a source line SL. Some of the memory strings ST may share some of the word lines WL.

Two or more global word lines GWL may be coupled to word lines in parallel. For example, the global word lines GWL may extend in the bit line direction. The two or more global word lines GWL may be coupled to the word lines WL through the plurality of path circuits 151A, 151B, and 151C.

The plurality of path circuits 151A, 151B, and 151C of the path circuit group 150 (see FIG. 1) may electrically connect the global word lines GWL to the word lines WL in response to the plurality of block select signals BLKWL<n:0> generated by the block decoder 140 (see FIG. 1).

In an embodiment, two or more global word lines are provided in one memory cell array, so that shorter lengths of the word lines WL connected to one global word line GWL may reduce the load on the word lines. Accordingly, a time for applying the operation voltage to the word line during the general operation of the semiconductor memory device may be reduced.

Although FIG. 6 illustrates only three global word lines GWL, the number of the global word lines GWL is not limited thereto. For example, one global word line WL may be assigned to the memory strings ST connected to one bit line.

Each of the plurality of bit lines BL1 to BLm may be coupled to one of the plurality of page buffers PB1 to PBm included in the read/write circuit 120. Each of the plurality of page buffers PB1 to PBm may include a plurality of sub-page buffers S_PB1 and S_PB2 and a main page buffer M_PB. Each of the plurality of bit lines BL1 to BLm may be divided into a plurality of internal bit lines (e.g., BL1_A, BL1_B, and BL1_C) by the plurality of sub-page buffers S_PB1 and S_PB2 and the main page buffer M_PB.

For example, the bit line BL1 may include the internal bit line BL1_A coupled to the sub-page buffer S_PB1, the internal bit line BL1_B coupled between the sub-page buffer S_PB1 and the sub-page buffer S_PB2, and the internal bit line BL1_C coupled between the sub-page buffer S_PB2 and the main page buffer M_PB.

When the plurality of bit lines BL1 to BLm is precharged during the general operation of the semiconductor memory device, the sub-page buffer S_PB1 may precharge the internal bit line BL1_A, the sub-page buffer S_PB2 may precharge the internal bit line BL1_B, and the main page buffer M_PB may precharge the internal bit line BL1_C.

During the precharge operation of the bit line, each of the plurality of bit lines BL1 to BLm may be divided into the plurality of internal bit lines BL1_A, BL1_B, and BL1_C, and the internal bit lines BL1_A, BL1_B, and BL1_C may be precharged by the plurality of sub-page buffers S_PB1 and S_PB2 and the main page buffer M_PB, thereby decreasing a precharge time.

Further, when threshold voltages of the memory cells of the memory strings ST may be sensed during the general operation of the semiconductor memory device, the sub-page buffer S_PB1 may sense threshold voltages of the memory cells of the memory strings ST coupled to the internal bit line BL1_A, and the sub-page buffer S_PB2 may sense threshold voltages of the memory cells of the memory strings ST coupled to the internal bit line BL1_B. The data sensed by the sub-page buffer S_PB1 and the sub-page buffer S_PB2 may be transmitted to the main page buffer M_PB and used for a verification operation, or may be output to the outside.

Figure 7:
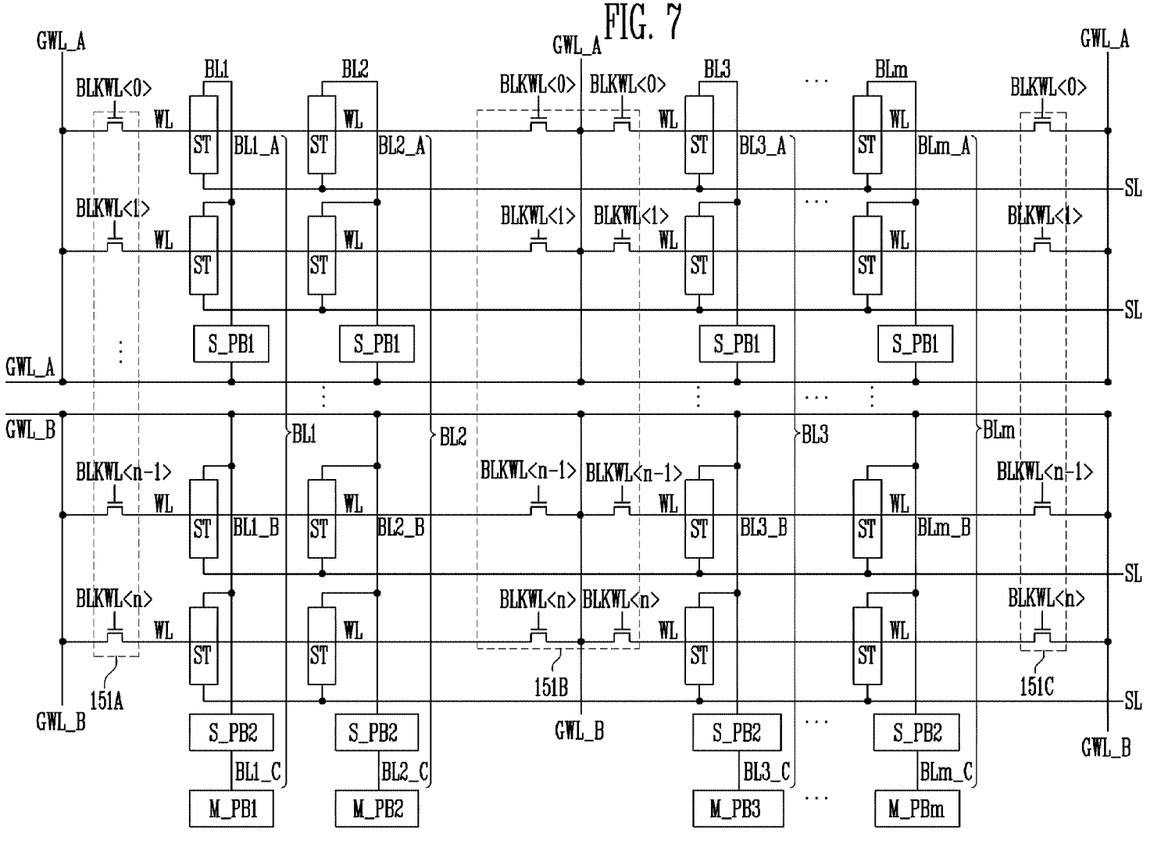
FIG. 7 is a diagram illustrating an example configuration of a memory cell array, a global word line, and a read/write circuit according to an embodiment of the present disclosure.

FIG. 7 is a diagram illustrating an example configuration of the memory cell array, the global word lines, and the read/write circuit according to an embodiment of the present disclosure.

Referring to FIG. 7, the memory cell array may include a plurality of memory strings ST. The plurality of memory strings ST may be coupled between a plurality of bit lines BL1 to BLm and a source line SL. Some of the memory strings ST may share some of the word lines WL.

In an embodiment, first and second global word line groups GWL_A and GWL_B may be disposed at a center portion of the memory cell array in parallel along a word line direction. Further, the first and second global word line groups GWL_A and GWL_B may include global word lines extending in a bit line direction. The global word lines included in the first and second global word line groups GWL_A and GWL_B may extend in opposite directions. The first and second global word line groups GWL_A and GWL_B may include two or more global word lines extending in the bit line direction.

For example, when the memory cell array is divided into an upper side and a lower side, the first global word line group GWL_A may include two or more global word lines extending in the bit line direction at the upper side of the memory cell array, and the second global word line group GWL_B may include two or more global word lines extending in the bit line direction at the lower side of the memory cell array.

Although FIG. 7 illustrates that the two global word line groups GWL_A and GWL_B are assigned to one memory cell array, the number of the global word line group is not limited thereto. Further, although FIG. 7 illustrates that only three global word lines extend in the bit line direction in the first and second global word line groups GWL_A and GWL_B, the number of the global word lines of the first and second global word line groups GWL_A and GWL_B is not limited thereto. For example, one global word line WL may be assigned to the memory strings ST connected to one bit line.

The global word lines of the first and second global word line groups GWL_A and GWL_B may be coupled to the word lines WL through the plurality of path circuits 151A, 151B, and 151C of the path circuit group 150 (see FIG. 1).

The plurality of path circuits 151A, 151B, and 151C of the path circuit group 150 (see FIG. 1) may electrically connect the global word lines of the first and second global word line groups GWL_A and GWL_B to the word lines WL in response to the plurality of block select signals BLKWL<n:0> generated by the block decoder 140 (see FIG. 1).

In an embodiment, two or more first and second global word line groups GWL_A and GWL_B may be provided in one memory cell array, so that shorter lengths of the global word lines may reduce the load on the word lines connected to the global word lines. Accordingly, a time for applying the operation voltage to the word line may be reduced according to the decrease in the propagation delay during the general operation of the semiconductor memory device.

Each of the plurality of bit lines BL1 to BLm may be coupled to one of the plurality of page buffers PB1 to PBm included in the read/write circuit 120. Each of the plurality of page buffers PB1 to PBm may include a plurality of sub-page buffers S_PB1 and S_PB2 and a main page buffer M_PB. Each of the plurality of bit lines BL1 to BLm may be divided into a plurality of internal bit lines (e.g., BL1_A, BL1_B, and BL1_C) by the plurality of sub-page buffers S_PB1 and S_PB2 and the main page buffer M_PB.

For example, the bit line BL1 may include the internal bit line BL1_A coupled to the sub-page buffer S_PB1, the internal bit line BL1_B coupled between the sub-page buffer S_PB1 and the sub-page buffer S_PB2, and the internal bit line BL1_C coupled between the sub-page buffer S_PB2 and the main page buffer M_PB.

When the plurality of bit lines BL1 to BLm is precharged during the general operation of the semiconductor memory device, the sub-page buffer S_PB1 may precharge the internal bit line BL1_A, the sub-page buffer S_PB2 may precharge the internal bit line BL1_B, and the main page buffer M_PB may precharge the internal bit line BL1_C.

During the precharge operation of the bit line, each of the plurality of bit lines BL1 to BLm may be divided into the plurality of internal bit lines BL1_A, BL1_B, and BL1_C, and the internal bit lines BL1_A, BL1_B, and BL1_C may be precharged by the plurality of sub-page buffers S_PB1 and S_PB2 and the main page buffer M_PB, thereby decreasing a precharge time.

Further, when threshold voltages of the memory cells of the memory strings ST are sensed during the general operation of the semiconductor memory device, the sub-page buffer S_PB1 may sense threshold voltages of the memory cells of the memory strings ST coupled to the internal bit line BL1_A, and the sub-page buffer S_PB2 may sense threshold voltages of the memory cells of the memory strings ST coupled to the internal bit line BL1_B. The data sensed by the sub-page buffer S_PB1 and the sub-page buffer S_PB2 may be transmitted to the main page buffer M_PB and may be used for a verification operation, or may be output to the external device.

Figure 8:
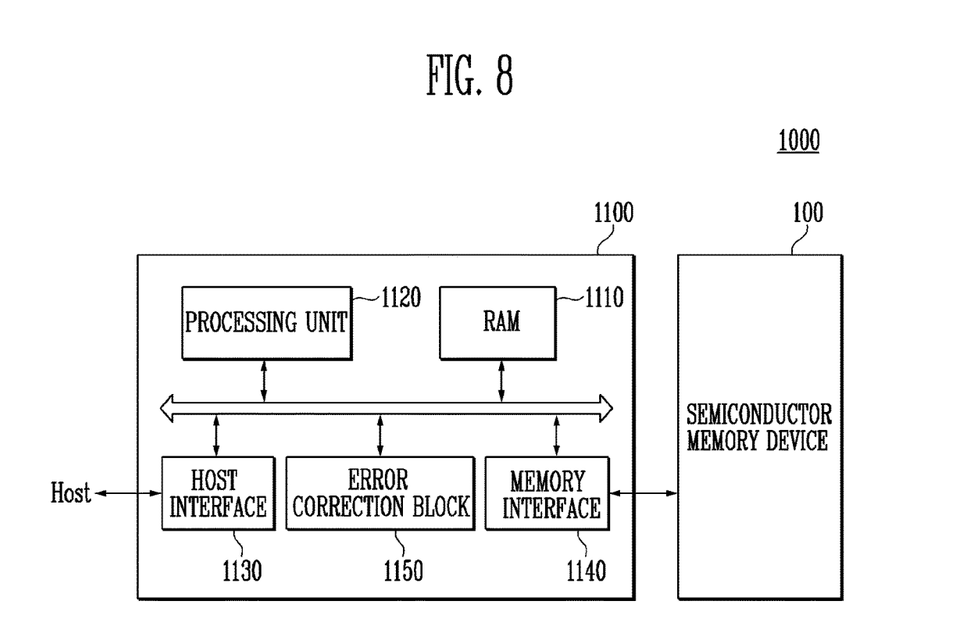
FIG. 8 is a diagram illustrating an example of a memory system including the semiconductor memory device of FIG. 1.

FIG. 8 is a diagram illustrating an example of a memory system including the semiconductor memory device of FIG. 1.

Referring to FIG. 8, the memory system 1000 may include a semiconductor memory device 100 and a controller 1100.

A configuration of the semiconductor memory device 100 may be the same as that of the semiconductor memory device described with reference to FIG. 1, and thus any repetitive detailed description will be omitted or simplified.

The controller 1100 may be coupled to a host Host and the semiconductor memory device 100. The controller 1100 may access the semiconductor memory device 100 in response to a request from the host Host. For example, the controller 1100 may control the read, write, erase, and background operations of the semiconductor memory device 100. The controller 1100 may provide an interface between the semiconductor memory device 100 and the host Host. The controller 1100 may drive firmware for controlling the semiconductor memory device 100.

The controller 1100 may include a Random Access Memory (RAM) 1110, a processing unit 1120, a host interface 1130, a memory interface 1140, and an error correction circuit 1150. The RAM 1110 may be used as at least one of a working memory of the processing unit 1120, a cache memory between the semiconductor memory device 100 and the host Host, and a buffer memory between the semiconductor memory device 100 and the host Host. The processing unit 1120 may control a general operation of the controller 1100. Further, the controller 1100 may temporarily store program data provided from the host Host during the write operation.

The host interface 1130 may include a protocol for performing a data exchange between the host Host and the controller 1100. In an embodiment, the controller 1100 may communicate with the host Host through at least one of various interface protocols, such as a Universal Serial Bus (USB) protocol, a Multimedia Card (MMC) protocol, a Peripheral Component Interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, and an Integrated Drive Electronics (IDE) protocol, and a private protocol.

The memory interface 1140 may interface with the semiconductor memory device 100. For example, the memory interface may include a NAND interface or a NOR interface.

The error correction circuit 1150 may detect/correct an error of the data received from the semiconductor memory device 100 by using an Error Correction Code (ECC). In an embodiment, the error correction circuit may be provided as a component of the controller 1100.

The controller 1100 and the semiconductor memory device 100 may be integrated into one semiconductor device. In an embodiment, the controller 1100 and the semiconductor memory device 100 may be integrated into a memory card. For example, the controller 1100 and the semiconductor memory device 100 may be integrated into a memory card such as a PC card (Personal Computer Memory Card International Association (PCMCIA)), a Compact Flash (CF) card, Smart Media Cards (e.g., SM, SMC), a memory stick, multimedia cards (e.g., MMC, RS-MMC, and MMCmicro), SD cards (e.g., SD, miniSD, microSD, and SDHC), and a Universal Flash Storage (UFS).

The controller 1100 and the semiconductor memory device 100 may be integrated into a semiconductor drive (e.g., Solid State Drive (SSD)). The semiconductor drive (e.g., SSD) may include a storage device that stores data in a semiconductor memory.

For another example, the memory system 1000 may be provided as one of various components of an electronic device, such as a computer, an ultra-mobile PC (UMPC, a workstation, a net-book computer, personal digital assistants (PDA), a portable computer, a web tablet PC, a wireless phone, a mobile phone, a smart phone, an e-book reader, a portable multimedia player (PMP), a portable game device, a navigation device, a black box, a digital camera, a 3-dimensiona television, a digital audio recorder, a digital audio player, a digital picture recorder, a digital picture player, a digital video recorder, a digital video player, a device capable transceiving information in a wireless environment, one of various electronic devices configuring a home network, one of various electronic devices configuring a computer network, one of various electronic devices configuring a telematics network, an RFID device, or one of various components of a computing system.

In an embodiment, the semiconductor memory device 100 or the memory system 1000 may be embedded in various types of packages. Examples of the packages may include Package on Package (PoP), Ball Grid Arrays (BGAs), Chip Scale Packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flat pack (TQFP), Small Outline (SOIC), Shrink Small Outline Package (SSOP), Thin Small Outline (TSOP), Thin Quad Flat pack (TQFP), System In Package (SIP), Multi Chip Package (MCP), Wafer-level Fabricated Package (WFP), and Wafer-Level Processed Stack Package (WSP).

Figure 9:
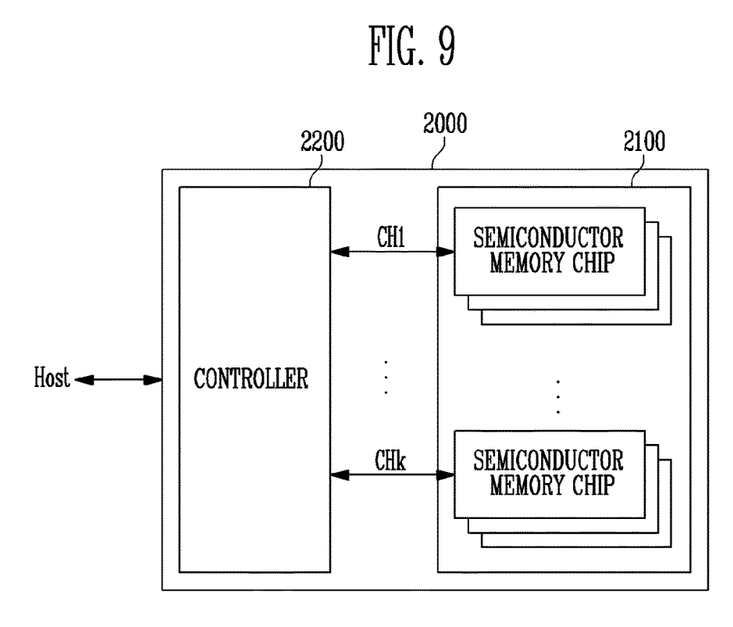
FIG. 9 is a diagram illustrating an application example of the memory system of FIG. 8.

FIG. 9 is a diagram illustrating an application example of the memory system of FIG. 8.

Referring to FIG. 9, the memory system 2000 may include a semiconductor memory device 2100 and a controller 2200. The semiconductor memory device 2100 may include a plurality of semiconductor memory chips. The plurality of semiconductor memory chips may be divided into a plurality of groups.

In FIG. 9, it is illustrated that the plurality of groups communicates with the controller 2200 through first to $k^{th}$ channels CH1 to CHk, respectively. Each semiconductor memory chip may be configured and operated in a similar manner to that of one of the semiconductor memory devices 100, 200, and 300 described with reference to FIG. 1, 3, or 5.

Each group may communicate with the controller 2200 through one common channel. The controller 2200 may be configured in a similar manner to the controller 1100 described with reference to FIG. 8, and may control the plurality of memory chips of the semiconductor memory device 2100 through the plurality of channels CH1 to CHk.

Figure 10:
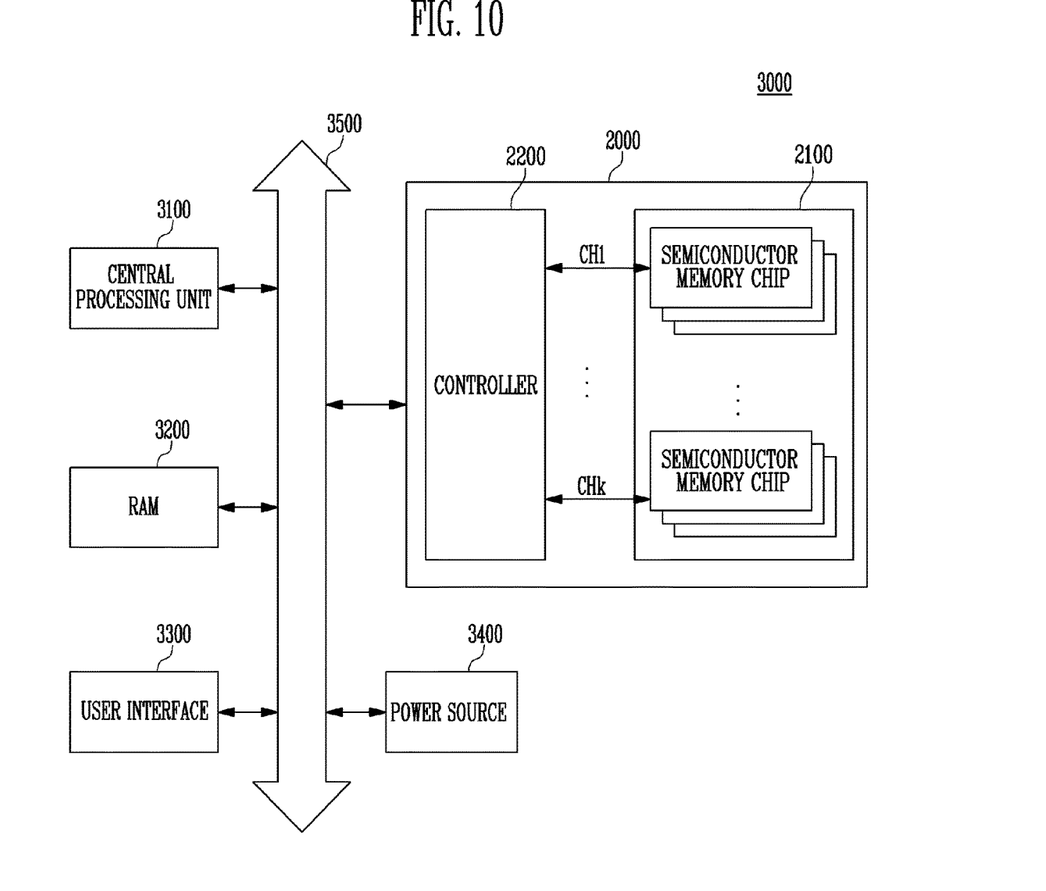
FIG. 10 is a diagram illustrating an example of a computing system including the memory system described with reference to FIG. 9.

FIG. 10 is a diagram illustrating an example of a computing system including the memory system described with reference to FIG. 9.

Referring to FIG. 10, a computing system 3000 may include a central processing unit 3100, a Random Access Memory (RAM) 3200, a user interface 3300, a power supply 3400, a system bus 3500, and the memory system 2000.

The memory system 2000 may be electrically connected to the central processing unit 3100, the RAM 3200, the user interface 3300, and the power supply 3400 through a system bus 3500. Data provided through the user interface 3300 or processed by the central processing unit 3100 may be stored in the memory system 2000.

In FIG. 10, it is illustrated that the semiconductor memory device 2100 is connected to the system bus 3500 through the controller 2200. However, the semiconductor memory device 2100 may be directly connected to the system bus 3500. In this case, a function of the controller 2200 may be performed by the central processing unit 3100 and the RAM 3200.

In FIG. 10, it is illustrated that the memory system 2000 described with reference to FIG. 9 is provided. However, the memory system 2000 may be substituted with the memory system 1000 described with reference to FIG. 8. In an embodiment, the computing system 3000 may include all of the memory systems 1000 and 2000 described with reference to FIGS. 8 and 9.

The detailed description of the present disclosure includes the description of the particular embodiments, but various modifications are available within the scope without departing from the scope and the technical spirit of the present disclosure. Therefore, the scope of the present disclosure is not limited to the embodiments described, but shall be defined by the claims to be described below and the equivalents to the claims.

What is claimed is:

1. A semiconductor memory device, comprising:
a memory cell array including a plurality of memory strings coupled to a plurality of bit lines; and
a plurality of page buffers coupled to the plurality of bit lines, respectively, each of the page buffers including a plurality of sub-page buffers and a main page buffer,
wherein a first sub-page buffer, among the plurality of sub-page buffers, is coupled between a first internal bit line and a second internal bit line, among the plurality of internal bit lines, the second sub-page buffer, among the plurality of sub-page buffers, is coupled between the second internal bit line and a third internal bit line, among the plurality of internal bit lines, and the main page buffer is coupled to the third internal bit line.

2. The semiconductor memory device of claim 1, wherein the first sub-page buffer performs a sensing operation in response to a first switching signal when sensing a program state of a memory string coupled to the first internal bit line, among the plurality of memory strings, and transfers sensed data in response to a second switching signal.

3. The semiconductor memory device of claim 1, wherein the second sub-page buffer performs a sensing operation in response to a first switching signal when sensing a program state of a memory string coupled to the second internal bit line, among the plurality of memory strings, and transfers sensed data to the main page buffer in response to a second switching signal.

4. The semiconductor memory device of claim 1, wherein the first sub-page buffer precharges the first internal bit line, the second sub-page buffer precharges the second internal bit line, and the main page buffer precharges the third internal bit line during a precharge operation of the bit line.

5. The semiconductor memory device of claim 1, wherein the first sub-page buffer and the second sub-page buffer sense data of a corresponding memory string and transmit the sensed data to the main page buffer during a sensing operation.

6. The semiconductor memory device of claim 1, wherein the first sub-page buffer includes:
a first switching circuit coupled between the first internal bit line and a sub sensing node to connect the first internal bit line to the sub sensing node during a precharge operation of the bit line and a sensing operation;
a precharge circuit coupled to the sub sensing node to precharge the first internal bit line through the sub sensing node during the precharge operation of the bit line;
a latch circuit configured to sense a potential level or an amount of current of the first internal bit line through the sub sensing node during the sensing operation and store sensing data; and
a second switching circuit coupled between the latch circuit and the second internal bit line to transmit the sensing data stored in the latch circuit to the second internal bit line during the sensing operation.

7. A semiconductor memory device, comprising:
a memory cell array including a plurality of memory strings coupled to a plurality of bit lines;
two or more global word lines extending along a direction to which the plurality of bit lines extends;
two or more path circuits configured to electrically connect the plurality of global word lines to word lines; and
a plurality of page buffers coupled to the plurality of bit lines, respectively, each of the page buffers including a plurality of sub-page buffers and a main page buffer,
wherein a first sub-page buffer, among the plurality of sub-page buffers, is coupled between a first internal bit line and a second internal bit line, among the plurality of internal bit lines, and the second sub-page buffer, among the plurality of sub-page buffers, is coupled between the second internal bit line and a third internal bit line, among the plurality of internal bit lines, and the main page buffer is coupled to the third internal bit line.

8. The semiconductor memory device of claim 7, wherein the two or more global word lines are divided into a first global word line group disposed at an upper side of the memory cell array, and a second global word line group disposed at a lower side of the memory cell array.

9. The semiconductor memory device of claim 7,
wherein the first sub-page buffer performs a sensing operation in response to a first switching signal when sensing a program state of a memory string coupled to the first internal bit line, among the plurality of memory strings, and transfers sensed data to a second sub-page buffer in response to a second switching signal.

10. The semiconductor memory device of claim 7,
wherein the second sub-page buffer performs a sensing operation in response to a first switching signal when sensing a program state of a memory string coupled to the second internal bit line, among the plurality of memory strings, and transfers sensed data to the main page buffer in response to a second switching signal.

* * * * *